(12) United States Patent
Ho et al.

(10) Patent No.: US 11,495,312 B2
(45) Date of Patent: Nov. 8, 2022

(54) MEMORY CIRCUIT AND MEMORY PROGRAMMING METHOD

(71) Applicant: Winbond Electronics Corp., Taichung (TW)

(72) Inventors: Wen-Chiao Ho, Taichung (TW); Pil-Sang Ryoo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/326,294

(22) Filed: May 20, 2021

(65) Prior Publication Data
US 2022/0157392 A1    May 19, 2022

(30) Foreign Application Priority Data
Nov. 18, 2020  (TW) ................................ 109140279

(51) Int. Cl.
| G11C 16/34 | (2006.01) |
| G11C 16/10 | (2006.01) |
| G11C 16/30 | (2006.01) |
| G11C 16/26 | (2006.01) |
| G11C 16/12 | (2006.01) |

(52) U.S. Cl.
CPC ........ G11C 16/3459 (2013.01); G11C 16/102 (2013.01); G11C 16/12 (2013.01); G11C 16/26 (2013.01); G11C 16/30 (2013.01)

(58) Field of Classification Search
None
See application file for complete search history.

(56) References Cited

U.S. PATENT DOCUMENTS

| 7,382,661 B1 * | 6/2008 | Lin | ........................ | G11C 16/10 |
| | | | | 365/185.23 |
| 2003/0093233 A1 * | 5/2003 | Rajguru | ................. | G11C 16/30 |
| | | | | 702/64 |

* cited by examiner

Primary Examiner — Alfredo Bermudez Lozada
(74) Attorney, Agent, or Firm — JCIPRNET (57) ABSTRACT

A memory circuit and a memory programming method adapted to program flash memory are provided. The memory circuit includes a charge pumping circuit, a voltage regulator, a voltage sensor, and a plurality of switch circuits. The charge pumping circuit generates a pumping voltage and a pumping current. The voltage regulator is coupled to the charge pumping circuit and generates a programming voltage and a programming current to program the flash memory according to the pumping voltage and the pumping current. The voltage sensor is coupled to the voltage regulator to monitor a voltage value of the programming voltage. Each of the plurality of switch circuits includes a first terminal coupled to the voltage sensor and a second terminal coupled to the flash memory. A quantity of the plurality of switch circuits that are turned on is determined by the voltage value of the programming voltage.

11 Claims, 6 Drawing Sheets

| Predetermined programming voltage $V_{PGM}=7V$, $V1=7V$, $V2=6V$ | | | |
|---|---|---|---|
| Monitored programming voltage $V_{Drain}$ | $\geq 7V$ | $7V\sim 6V$ | $\leq 6V$ |
| Programming path switch weight [1:0] | 00 | 10 | 11 |
| Turned off programming paths | None | Y7/Y6 | Y7/Y6/Y5/Y4/Y3/Y2 |

MEMORY CIRCUIT AND MEMORY PROGRAMMING METHOD

CROSS-REFERENCE TO RELATED APPLICATION

This application claims the priority benefit of Taiwan application serial no. 109140279, filed on Nov. 18, 2020. The entirety of the above-mentioned patent application is hereby incorporated by reference herein and made a part of this specification.

BACKGROUND

Technical Field

The disclosure relates to a circuit; particularly, the disclosure relates to a memory circuit and a memory programming method.

Description of Related Art

Charge pumping circuits and voltage regulators are often adopted to program flash memory. The charge pumping circuit generates a pumping voltage and a pumping current to the voltage regulator, and then the voltage regulator generates a programming voltage and a programming current according to the pumping voltage and the pumping current received to program the flash memory.

However, due to uncertainty in various combinations of semiconductor process variation, circuit operating temperature variation, memory leakage currents, and the like, such uncertainty requires to be taken into consideration when designing the charge pumping circuit, so that with the pumping voltage and pumping current provided by the charge pumping circuit, in the case of a predetermined programming voltage, the flash memory is supplied with the highest programming current consumed in the most power-consuming condition due to the uncertainty in the combinations during programming.

Such design of the charge pumping circuit requires to provide a sufficient programming current, therefore leading to an overly large circuit area and increasing the costs.

SUMMARY

The disclosure provides a memory circuit and a memory programming method. For a charge pumping circuit therein, in designing a pumping voltage and a pumping current of the charge pumping circuit, the uncertainty in the combinations in the most power-consuming case is not required to be taken into consideration, but only the uncertainty in the combinations occurring in a typical case is required to be taken into consideration.

The memory circuit of the disclosure is adapted to program flash memory. The memory circuit includes a charge pumping circuit, a voltage regulator, a voltage sensor, and a plurality of switch circuits. The charge pumping circuit generates a pumping voltage and a pumping current. The voltage regulator is coupled to the charge pumping circuit and generates a programming voltage and a programming current to program the flash memory according to the pumping voltage and the pumping current. The voltage sensor is coupled to the voltage regulator to monitor a voltage value of the programming voltage. Each of the plurality of switch circuits includes a first terminal coupled to the voltage sensor and a second terminal coupled to the flash memory. A quantity of the plurality of switch circuits that are turned on is determined by the voltage value of the programming voltage.

The memory programming method of the disclosure is adapted to program flash memory, including the following. A programming voltage and a programming current are generated. A plurality of programming paths are set to be all turned on, and, during a program pulse period, the flash memory is programmed by the programming voltage and the programming current via the plurality of programming paths. After the program pulse period ends, a voltage value of the programming voltage is monitored; whether the programming voltage is greater than or equal to a predetermined programming voltage is determined; the programming voltage is compared with a plurality of predetermined voltages, and a switch weight of the plurality of programming paths is generated according to a comparison result; some of the plurality of programming paths are selectively turned off according to the switch weight of the plurality of programming paths; and whether a programming verification is passed is determined.

The memory programming method of the disclosure is adapted to program flash memory, including the following. A programming voltage and a programming current is generated. A plurality of programming paths are set to be all turned on. During a program pulse period, the flash memory is programmed by the programming voltage and the programming current via the plurality of programming paths; a voltage value of the programming voltage is monitored; the programming voltage is compared with a plurality of predetermined voltages, and a switch weight of the plurality of programming paths is generated according to a comparison result; and some of the plurality of programming paths are selectively turned off according to the switch weight of the plurality of programming path. After the program pulse period ends, whether a programming verification is passed is determined.

Based on the foregoing, for the memory circuit and the memory programming method provided in the disclosure, only the uncertainty in the combinations occurring in a typical case is required to be taken into consideration in designing the pumping voltage and the pumping current of the charge pumping circuit, therefore reducing the circuit area and the costs.

To make the aforementioned more comprehensible, several embodiments accompanied with drawings are described in detail as follows.

DESCRIPTION OF THE EMBODIMENTS

Hereinafter, description of the embodiment of the disclosure is made with reference to the drawings.

Figure 1:
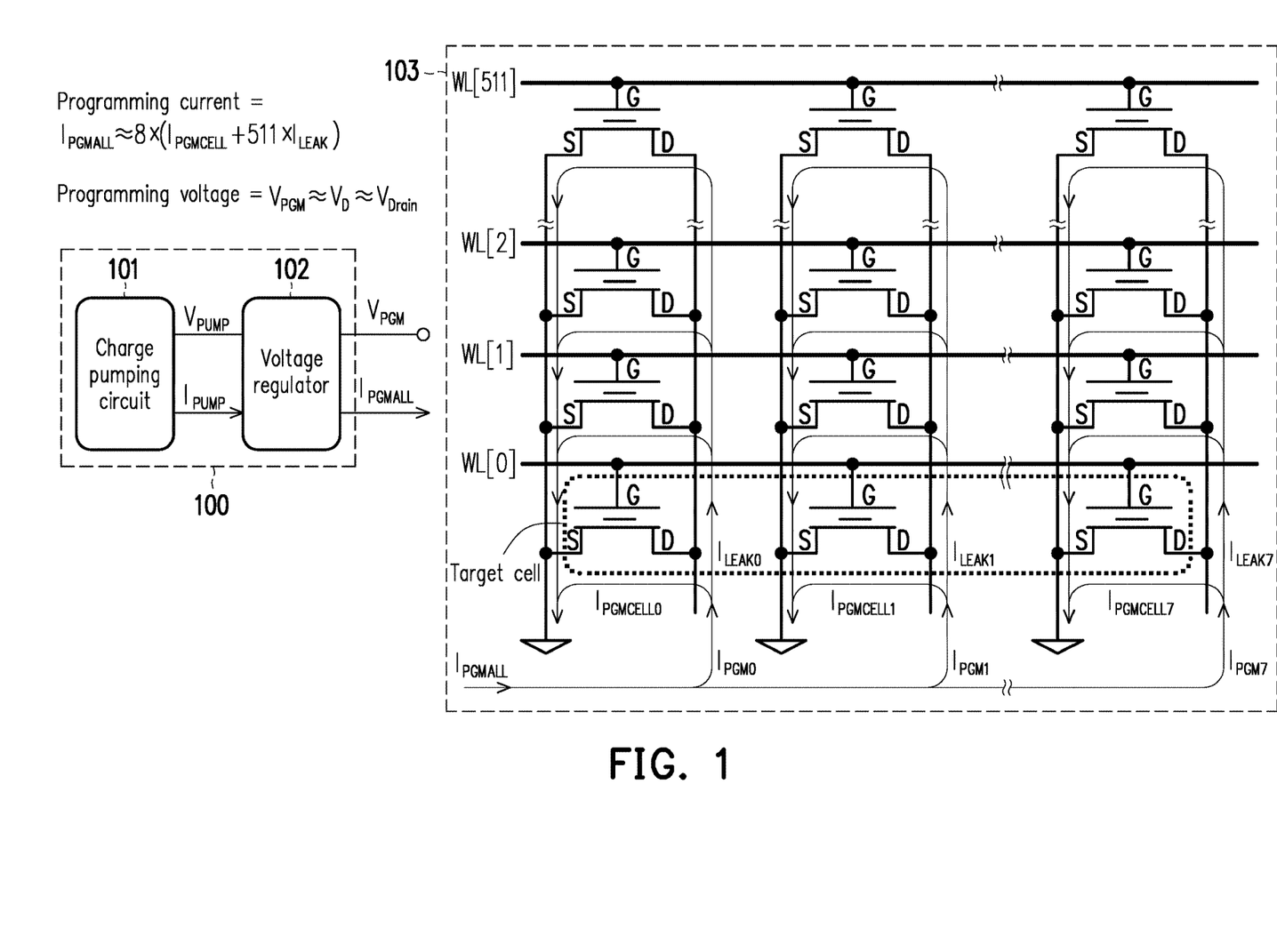
FIG. 1 is a diagram showing an example of a memory circuit of the disclosure programming flash memory with a programming voltage and a programming current.

FIG. 1 is a diagram showing an example of a memory circuit 100 of the disclosure programming flash memory 103 with a predetermined programming voltage $V_{PGM}$ and a total programming current $I_{PGMALL}$. The memory circuit 100 includes a charge pumping circuit 101 and a voltage regulator 102, the charge pumping circuit 101 generates a pumping voltage $V_{PUMP}$ and a pumping current $I_{PUMP}$ to the voltage regulator 102, the voltage regulator 102 generates the predetermined programming voltage $V_{PGM}$ and the total programming current $I_{PGMALL}$ according to the pumping voltage $V_{PUMP}$ and the pumping current $I_{PUMP}$ to the flash memory 103 to program the flash memory 103.

As shown in FIG. 1, the flash memory 103 includes 512 rows and 8 columns, and thus includes 512*8 memory cells, but the disclosure is not limited thereto. A switch of the memory cell in the $n^{th}$ row is the switch that is coupled to a gate (G) of the memory cell in the $n^{th}$ row and controls the memory cell in the $n^{th}$ row through a word line WL[n−1]. Drains (D) of the memory cells in the $m^{th}$ column share a bit line BL[m−1] (not shown) and receive the predetermined programming voltage $V_{PGM}$ ($V_{PGM} \approx V_D \approx V_{Drain}$) and the programming current $I_{PGM(m-1)}$ corresponding to the memory cells in the $m^{th}$ column from the memory circuit 100, where n is an integer from 1 to 512, and m is an integer from 1 to 8. In addition, a source (S) of each memory cell is coupled to a reference voltage (e.g., 0V).

As shown in FIG. 1, when a target cell to be programmed by the memory circuit 100 is the 1$^{st}$ row of the flash memory 103, WL[0] is set to a high voltage (e.g., 10V), and WL[1] to WL[511] are set to a low voltage (e.g., 0V). At this time, the total programming current $I_{PGMALL}$ consumed by the flash memory 103 may be represented by Formula 1.

$$I_{PGMALL} \approx 8*(I_{PGMCELL} + 511*I_{LEAK}) \quad \text{(Formula 1)},$$

where $I_{PGMCELL}$ is an average of the programming current consumed by each of the memory cells ($I_{PGMCELL0}$ to $I_{PGMCELL7}$) in the 1$^{st}$ row of the flash memory 103, and $I_{LEAK}$ is an average of the leakage current consumed by each of the memory cells in the 2$^{nd}$ row to the 512$^{th}$ row of the flash memory 103.

According to Formula 1, the total programming current $I_{PGMALL}$ consumed by the flash memory 103 varies according to the number of and the programming current consumed by the memory cells to be programmed by the memory circuit 100, and the leakage current of the unprogrammed memory cell. The programming current of the memory cell to be programmed and the leakage current of the unprogrammed memory cell vary due to uncertainty in various combinations of semiconductor process variation, circuit operating temperature variation, and the like. The total programming current $I_{PGMALL}$ consumed by the flash memory 103 in a typical condition (e.g., a typical temperature or process) may be set to $I_{PGMALL\_TYPICAL}$, and in an extreme condition (e.g., an extremely power-consuming temperature or process), may be set to $I_{PGMALL\_MAX}$.

Figure 2:
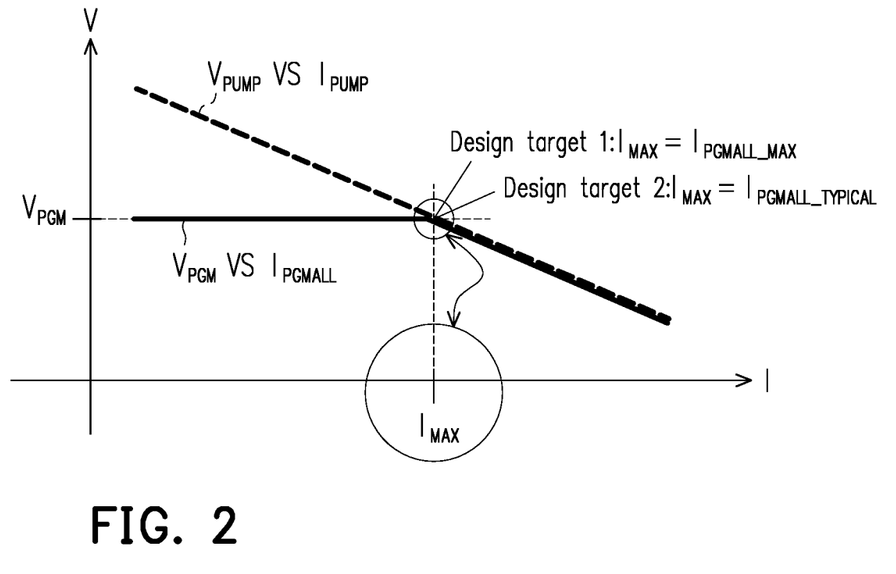
FIG. 2 is a diagram showing respective voltage-current load lines of the charge pumping circuit and the voltage regulator in the memory circuit of the disclosure.

FIG. 2 is a diagram showing respective voltage-current load lines of the charge pumping circuit 101 and the voltage regulator 102 in the memory circuit 100 of the disclosure. Herein, the pumping voltage $V_{PUMP}$ and the pumping current $I_{PUMP}$ generated by the charge pumping circuit 101 are inversely proportional. In other words, as the pumping voltage $V_{PUMP}$ increases, the pumping current $I_{PUMP}$ decreases (as shown by the broken line in FIG. 2). The predetermined programming voltage $V_{PGM}$ generated by the voltage regulator 102 may be determined depending on design specifications. A current value $I_{MAX}$ corresponding to the intersecting point between the voltage-current load line of the charge pumping circuit 101 (as shown by the broken line in FIG. 2) and the line representing the voltage V equal to the predetermined programming voltage $V_{PGM}$ represents a maximum current that can be output by the voltage regulator 102 when an output voltage is the predetermined programming voltage $V_{PGM}$.

A design target 1 as shown in FIG. 2 represents that $I_{MAX}$ is set to $I_{PGMALL\_MAX}$, and a design target 2 represents that $I_{MAX}$ is set to $I_{PGMALL\_TYPICAL}$. The design target 1 enables the current that can be output by the voltage regulator 102 when the output voltage is the predetermined programming voltage $V_{PGM}$ to cover the current consumed by the flash memory 103 in all conditions (including the extremely power-consuming temperature and process), and the design target 2 enables the current that can be output by the voltage regulator 102 when the output voltage is the predetermined programming voltage $V_{PGM}$ to cover the current consumed by the flash memory 103 in a typical condition (a typical temperature or process). Compared with the design target 1, the charge pumping circuit 101 of the design target 2 adopted in the disclosure has a smaller area and lower costs since it is not required to provide a pumping current $I_{PUMP}$ as large as that of the design target 1.

Figure 3:
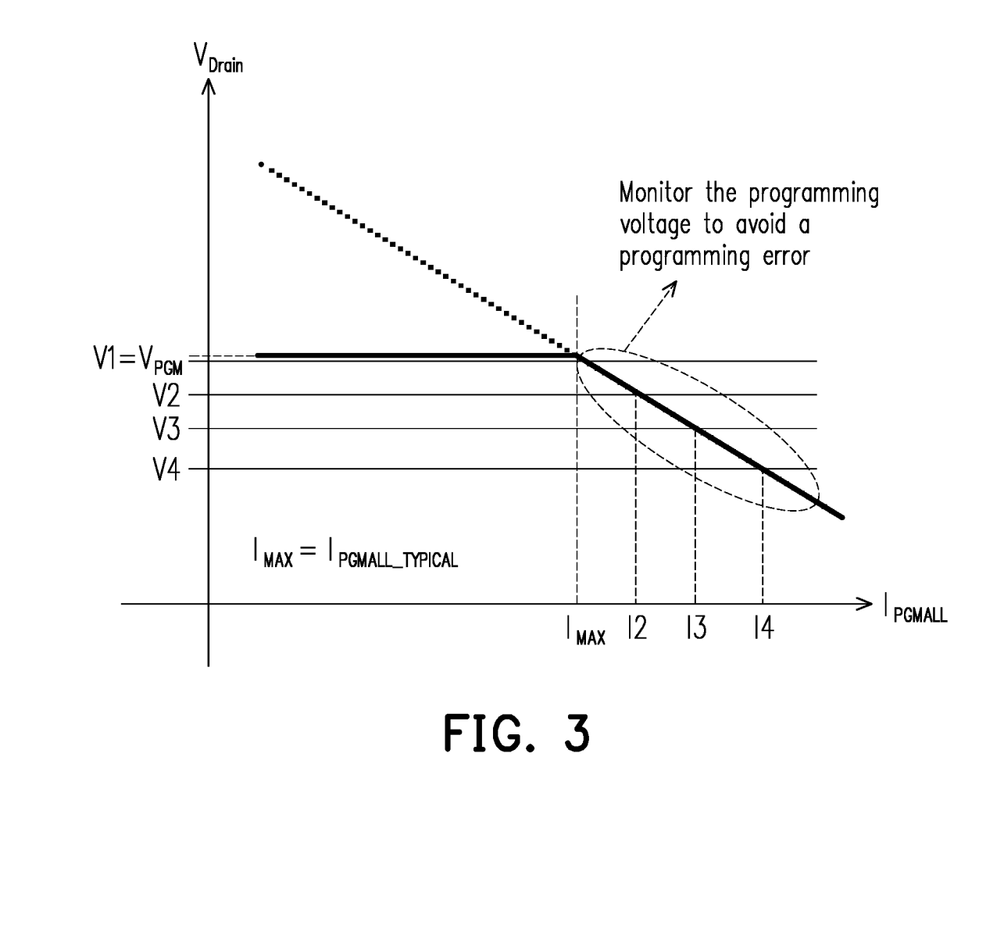
FIG. 3 is a diagram showing a correspondence relationship between a monitored programming voltage and the programming current when the monitored programming voltage is less than the predetermined programming voltage in the memory circuit of the disclosure.
Figure 4:
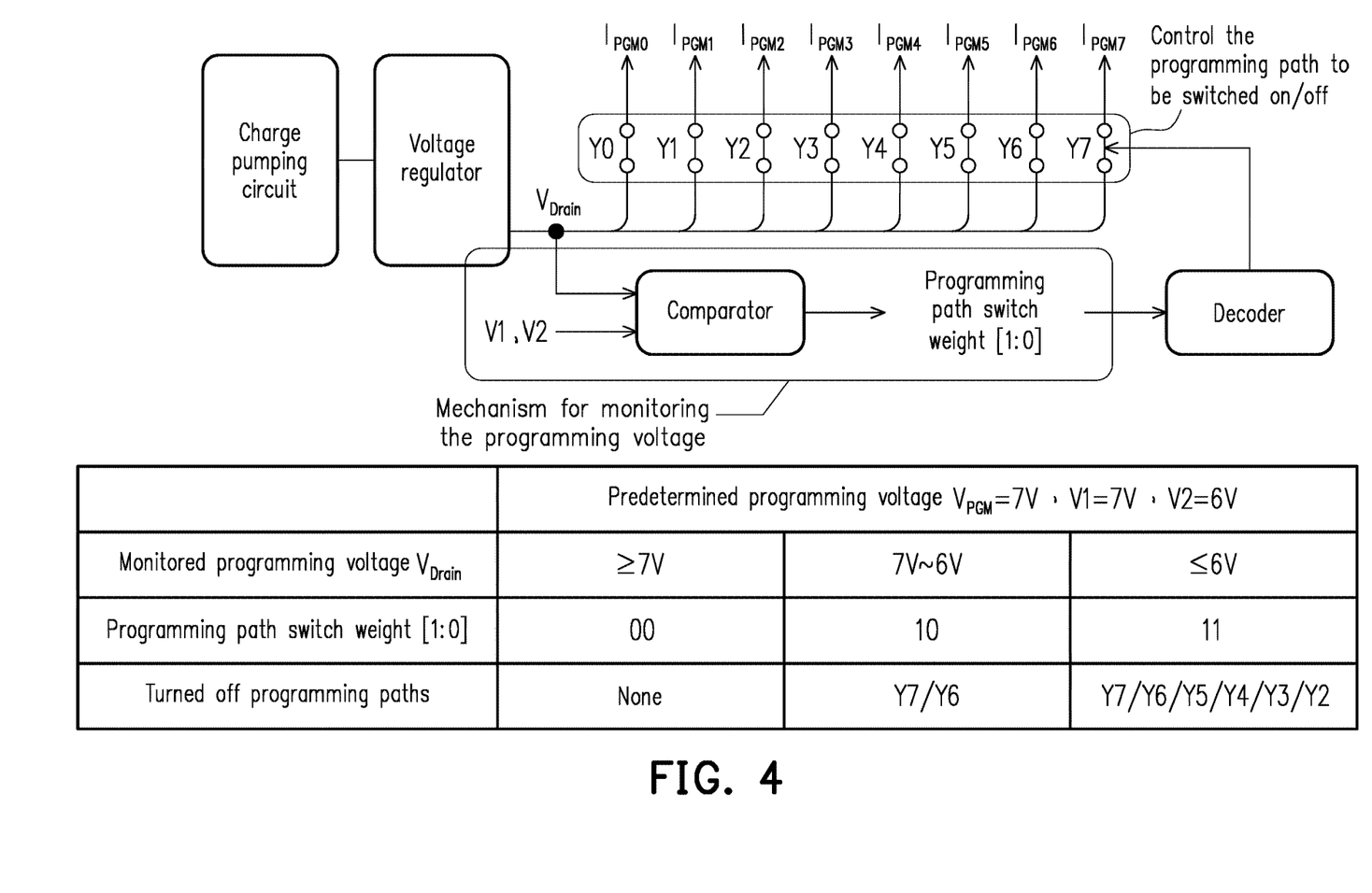
FIG. 4 is a diagram showing a correspondence relationship between the monitored programming voltage, a switch weight of a programming path, and a turned-off programming path in the memory circuit of the disclosure.

With reference to FIG. 3 and FIG. 4, FIG. 3 is a diagram showing a correspondence relationship between a monitored programming voltage $V_{Drain}$ and the total programming current $I_{PGMALL}$ when the monitored programming voltage $V_{Drain}$ is less than the predetermined programming voltage $V_{PGM}$ (i.e., when $I_{PGMALL} > I_{MAX} = I_{PGMALL\_TYPICAL}$) in the memory circuit of the disclosure. The purpose of the monitored programming voltage $V_{Drain}$ is to ensure that the flash memory 103 can be programmed with the predetermined programming voltage $V_{PGM}$.

In FIG. 4, Y0 to Y7 are a plurality of switch circuits. One terminal of each of the plurality of switch circuits Y0 to Y7 is coupled to the voltage output terminal of the voltage regulator 102. The other terminals of the plurality of switch circuits Y0 to Y7 are respectively coupled to the bit lines BL[0] to BL[7] of the flash memory 103. The plurality of switch circuits Y0 to Y7 control each programming path to be switched on/off through the above coupling manner. A voltage sensor (not shown) including a comparator monitors the programming voltage $V_{Drain}$. The mechanism with which the voltage sensor monitors the programming voltage $V_{Drain}$ includes sensing the programming voltage $V_{Drain}$, outputting the same to an input terminal of the comparator to be compared with a plurality of predetermined voltages (such as but not limited to V1 and V2) on another input terminal of the comparator. In addition, a comparison result representing a switch weight of each programming path (for example but not limited to a two-bit programming path switch weight [1:0]) is output to a decoder, and the decoder outputs control signals to control terminals of the plurality of switch circuits Y0 to Y7 according to the programmed path switch weight [1:0] to selectively switch the plurality of switch circuits Y0 to Y7 on or off.

The table of FIG. 4 is an example of the voltage sensor monitoring the programming voltage $V_{Drain}$ and controlling each programming path to be switched on/off according to a monitoring result. It is set that the predetermined programming voltage $V_{PGM}=7V$, the predetermined voltage $V1=7V$, and the predetermined voltage $V2=6V$. When the voltage sensor monitors that the voltage value of the programming voltage $V_{Drain} \geq V1$ (=7V), the voltage sensor outputs a programming path switch weight [1:0]=[00] to the decoder, and the decoder outputs control signals to the control terminals of the plurality of switch circuits Y0 to Y7 according to the programming path switch weight [1:0]=[00] to turn on all of the plurality of switch circuits Y0 to Y7. In other words, at this time the total programming current $I_{PGMALL} < I_{MAX} = I_{PGMALL\_TYPICAL}$, and the flash memory 103 may be programmed with a programming voltage greater than or equal to the predetermined programming voltage $V_{PGM}$.

When the voltage sensor monitors that the voltage value of the programming voltage $V_{Drain}$ is between V1 and V2 (=6V) (i.e., V2<the programming voltage $V_{Drain}$<V1), the voltage sensor outputs a programming path switch weight [1:0]=[10] to the decoder, and the decoder outputs control signals to the control terminals of the plurality of switch circuits Y0 to Y7 according to the programming path switch weight [1:0]=[10] to turn off some of the switch circuits Y7 to Y6 and turn on some of the switch circuits Y0 to Y5. In other words, at this time the total programming current $I_{PGMALL} > I_{MAX} = I_{PGMALL\_TYPICAL}$, and the flash memory 103 is programmed with a programming voltage less than the predetermined programming voltage $V_{PGM}$. In order to avoid a programming error, the memory circuit 100 requires to temporarily turn off some of the programming paths to ensure that the flash memory 103 is programmed with a programming voltage greater than or equal to the predetermined programming voltage $V_{PGM}$.

When the voltage sensor monitors that the voltage value of the programming voltage $V_{Drain}$ is less than or equal to V2 (=6V), the voltage sensor outputs a programming path switch weight [1:0]=[11] to the decoder, the decoder outputs control signals to the control terminals of the plurality of switch circuits Y0 to Y7 according to the programming path switch weight [1:0]=[11] to turn off some of the switch circuits Y7 to Y2 and turn on some of the switch circuits Y0 to Y1. In other words, at this time the total programming current $I_{PGMALL} > I_{MAX} = I_{PGMALL\_TYPICAL}$ (and at this time the total programming current $I_{PGMALL}$ is greater than the total programming current $I_{PGMALL}$ when the programming path switch weight [1:0]=[10]), and the flash memory 103 is programmed with a programming voltage less than the predetermined programming voltage $V_{PGM}$. In order to avoid a programming error, the memory circuit 100 requires to temporarily turn off some of the programming paths to ensure that the flash memory 103 is programmed with a programming voltage greater than or equal to the predetermined programming voltage $V_{PGM}$.

Figure 5:
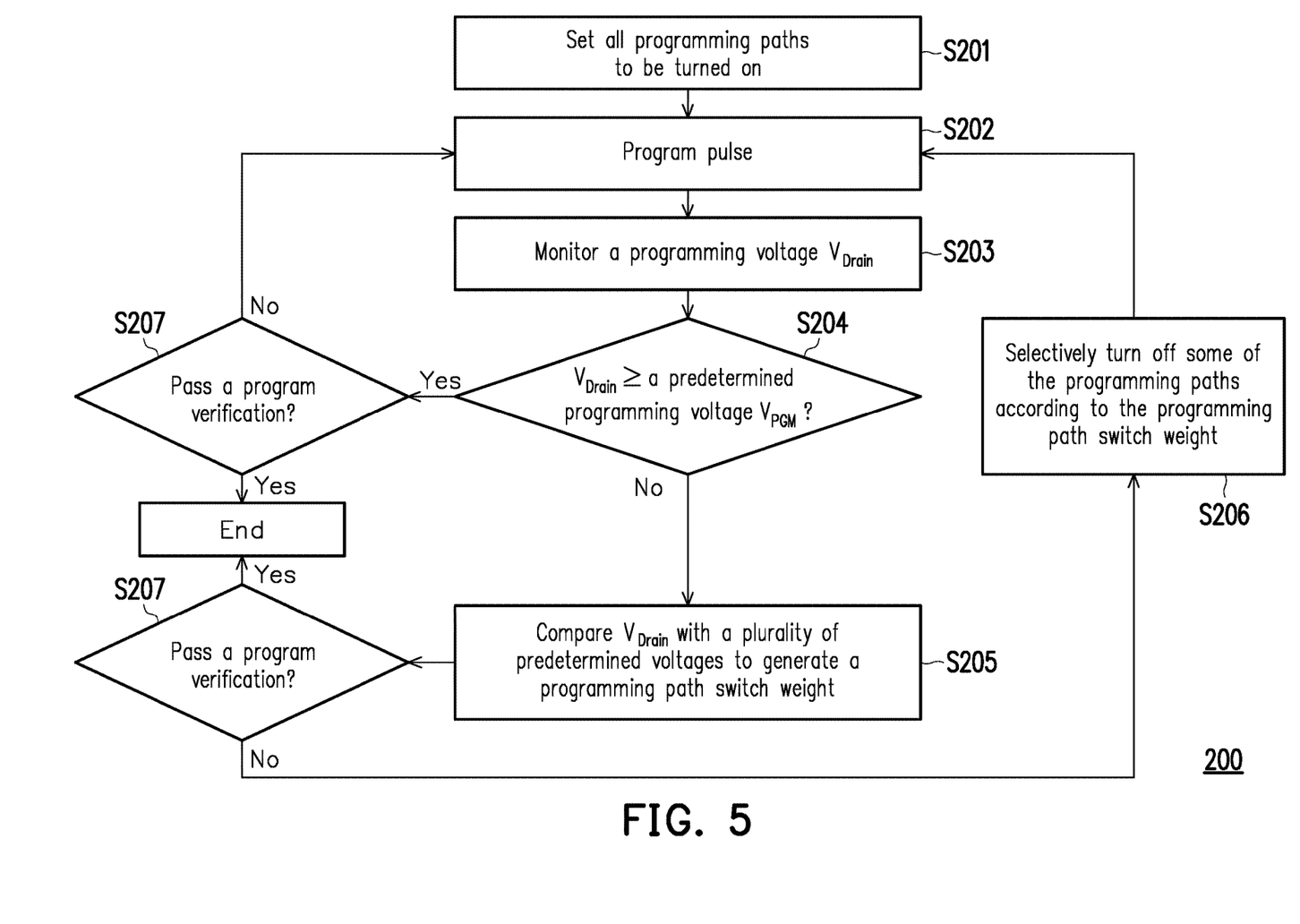
FIG. 5-6 are flow charts showing different memory programming methods of the disclosure.

FIG. 5 is a flow chart showing a memory programming method 200 of the disclosure, which is adapted to program the flash memory 103, and includes the following. All programming paths are set to be turned on in S201. The flash memory 103 is programmed during a program pulse period S202. After the program pulse period S202 ends, the programming voltage $V_{Drain}$ is monitored in S203. Whether the programming voltage $V_{Drain}$ is greater than or equal to the predetermined programming voltage $V_{PGM}$ is determined in S204. The programming voltage $V_{Drain}$ is compared with a plurality of predetermined voltages to generate a programming path switch weight in S205. According to the programming path switch weight, some of the programming paths is selectively turned off in S206. Whether the flash memory 103 passes a programming verification is determined in S207.

Figure 6:
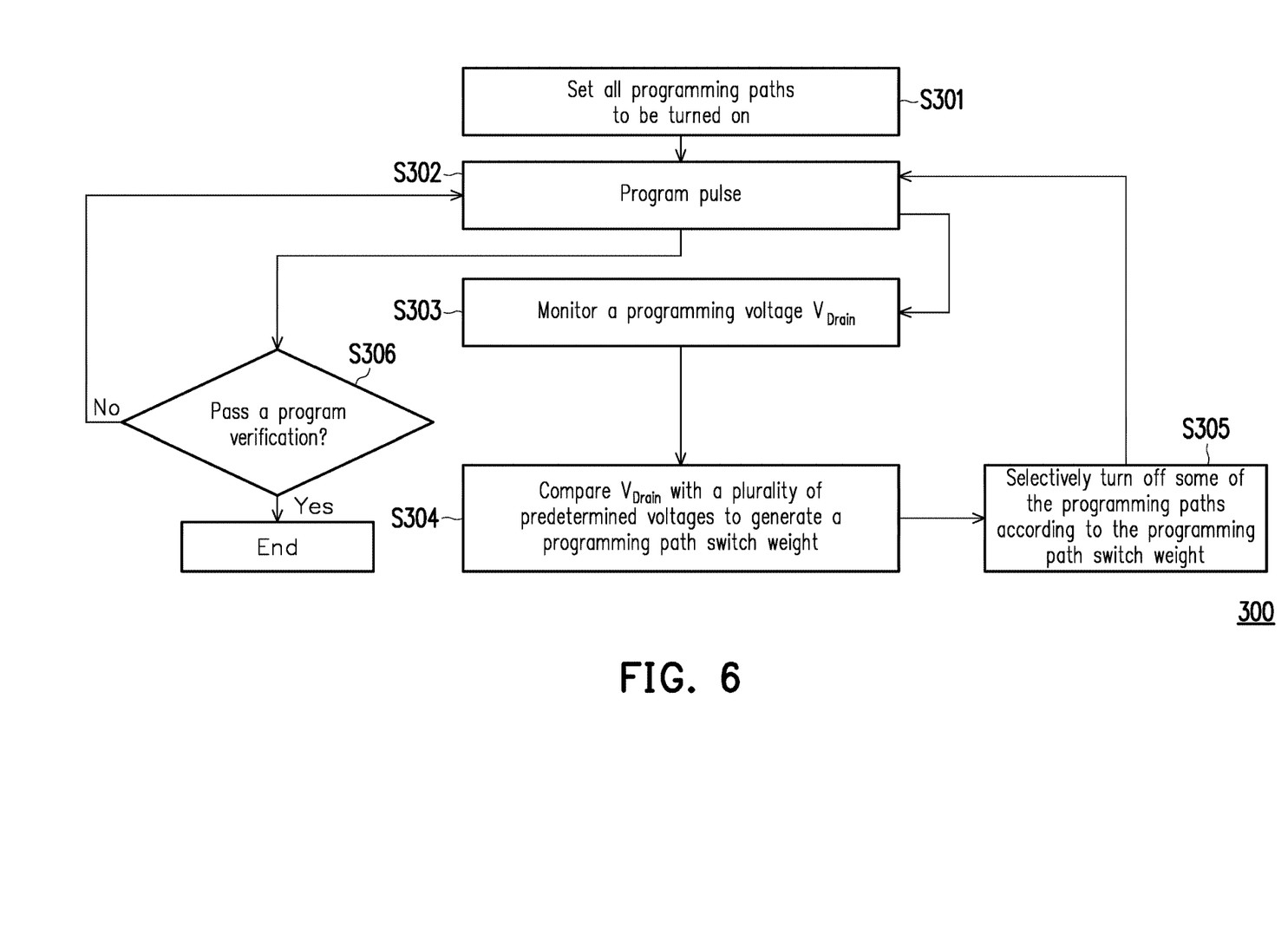

FIG. 6 is a flow chart showing another memory programming method of the disclosure, which is adapted to program the flash memory 103, and includes the following. All programming paths are set to be turned on in S301. During a program pulse period S302, the flash memory 103 is programmed; the programming voltage $V_{Drain}$ is monitored in S303; the programming voltage $V_{Drain}$ is compared with a plurality of predetermined voltages to generate a programming path switch weight in S304; according to the programming path switch weight, some of the programming paths is selectively turned off in S305. After the program pulse period S302 ends, whether the flash memory 103 passes a programming verification is determined in S306.

In summary of the foregoing, for the memory circuit and the memory programming method provided in the disclosure, only the uncertainty in the combinations occurring in a typical case is required to be taken into consideration in designing the pumping voltage and the pumping current of the charge pumping circuit, therefore reducing the circuit area and the costs.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory circuit adapted to program flash memory, the memory circuit comprising:
   a charge pumping circuit generating a pumping voltage and a pumping current;
   a voltage regulator coupled to the charge pumping circuit and generating a programming voltage and a programming current according to the pumping voltage and the pumping current to program the flash memory;
   a voltage sensor coupled to the voltage regulator to monitor a voltage value of the programming voltage; and
   a plurality of switch circuits each comprising a first terminal coupled to the voltage sensor and a second terminal coupled to the flash memory, wherein a quantity of the plurality of switch circuits that are turned on is determined according to the voltage value of the programming voltage,
   wherein the voltage sensor comprises a comparator, the comparator compares the voltage value of the programming voltage with a plurality of predetermined voltages to generate a comparison result, and the voltage sensor generates a switch weight of the plurality of switch circuits according to the comparison result.

2. The memory circuit according to claim 1, wherein the pumping voltage and the pumping current generated by the charge pumping circuit are inversely proportional.

3. The memory circuit according to claim 1, wherein the first terminal of each of the plurality of switch circuits is coupled to the voltage regulator, and the second terminals of the plurality of switch circuits are coupled to different bit lines of the flash memory.

4. The memory circuit according to claim 1, wherein the quantity of the plurality of switch circuits that are turned on is directly proportional to the voltage value of the programming voltage.

5. The memory circuit according to claim 1, wherein the plurality of predetermined voltages comprise a predetermined programming voltage and a first predetermined voltage, and the predetermined programming voltage is greater than the first predetermined voltage, when the programming voltage is greater than or equal to the predetermined programming voltage, the voltage sensor generates a first switch weight, when the programming voltage is less than the predetermined programming voltage and greater than the first predetermined voltage, the voltage sensor generates a second switch weight, and when the programming voltage is less than or equal to the first predetermined voltage, the voltage sensor generates a third switch weight.

6. The memory circuit according to claim 5, wherein the quantity of the plurality of switch circuits that are turned on is determined according to the switch weight.

7. The memory circuit according to claim 6, wherein when the voltage sensor generates the first switch weight, the plurality of switch circuits are all turned on.

8. The memory circuit as described in claim 6, wherein when the voltage sensor generates the second switch weight, a first quantity of the plurality of switch circuits are turned on, when the voltage sensor generates the third switch weight, a second quantity of the plurality of switch circuits are turned on, and the first quantity is greater than the second quantity.

9. The memory circuit according to claim 1, further comprising a decoder generating a control signal to a control terminal of each of the plurality of switch circuits according to the switch weight.

10. A memory programming method adapted to program flash memory, comprising:
   generating a programming voltage and a programming current;
   setting a plurality of programming paths to be all turned on, and, during a program pulse period, programming the flash memory by the programming voltage and the programming current via the plurality of programming paths; and
   after the program pulse period ends, monitoring a voltage value of the programming voltage;
   determining whether the programming voltage is greater than or equal to a predetermined programming voltage;
   comparing the programming voltage with a plurality of predetermined voltages, and generating a switch weight of the plurality of programming paths according to a comparison result;
   selectively turning off some of the plurality of programming paths according to the switch weight of the plurality of programming paths; and
   determining whether a programming verification is passed.

11. A memory programming method adapted to program flash memory, comprising:
   generating a programming voltage and a programming current;
   setting a plurality of programming paths to be all turned on;
   during a program pulse period, programing the flash memory by the programming voltage and the programming current via the plurality of programming paths;
   monitoring a voltage value of the programming voltage;
   comparing the programming voltage with a plurality of predetermined voltages, and generating a switch weight of the plurality of programming paths according to a comparison result; and
   selectively turning off some of the plurality of programming paths according to the switch weight of the plurality of programming paths; and
   after the program pulse period ends, determining whether a programming verification is passed.

* * * * *